United States Patent
Radic et al.

(10) Patent No.: US 11,901,414 B2
(45) Date of Patent: Feb. 13, 2024

(54) SEMICONDUCTOR DEVICE WITH A DEFECT LAYER AND METHOD OF FABRICATION THEREFOR

(71) Applicant: NXP B.V., Eindhoven (NL)

(72) Inventors: Ljubo Radic, Gilbert, AZ (US); Viet Thanh Dinh, Leuven (BE); Petrus Hubertus Cornelis Magnee, Malden (NL)

(73) Assignee: NXP B.V., Eindhoven (NL)

( * ) Notice: Subject to any disclaimer, the term of this patent is extended or adjusted under 35 U.S.C. 154(b) by 123 days.

(21) Appl. No.: 17/447,018

(22) Filed: Sep. 7, 2021

(65) Prior Publication Data

US 2023/0081675 A1 Mar. 16, 2023

(51) Int. Cl.
*H01L 29/10* (2006.01)
*H01L 29/08* (2006.01)
*H01L 29/737* (2006.01)

(52) U.S. Cl.
CPC ...... *H01L 29/1004* (2013.01); *H01L 29/0821* (2013.01); *H01L 29/7375* (2013.01)

(58) Field of Classification Search
CPC ............. H01L 29/1004; H01L 29/0821; H01L 29/7375
See application file for complete search history.

(56) References Cited

U.S. PATENT DOCUMENTS

| | | | |
|---|---|---|---|
| 2008/0054406 A1 | 3/2008 | Chen et al. | |
| 2008/0149929 A1* | 6/2008 | Giles | H01L 29/1079 257/E21.409 |
| 2010/0246249 A1* | 9/2010 | Vanhoucke | G11C 13/0004 365/163 |

FOREIGN PATENT DOCUMENTS

EP 0818829 A1 1/1998

OTHER PUBLICATIONS

Chai, Francis K. et al.; "Integration of Selectively Implanted Collector (SIC) of SiGe:C HBT for Optimised Performance and Manufacturability"; 2003 Proceedings of the Bipolar/BiCMOS Circuits and Technology Meeting (IEEE Cat. No. 03CH37440), Toulouse, France, Sep. 28-30, 2003; DOI: 10.1109/BIPOL.2003.1274948.

De Wolf, Peter et al.; "Cross-sectional nano-spreading resistance profiling"; Journal of Vacuum Science & Technology B: Microelectronics and Nanometer Structures Processing, Measurement, and Phenomena 16, 355 (1988); DOI: 10.1116/1.589810.

(Continued)

*Primary Examiner* — Syed I Gheyas
(74) *Attorney, Agent, or Firm* — Bruce M. Green (57) ABSTRACT

A semiconductor device includes a semiconductor substrate, a first semiconductor region of a first semiconductor type, formed within the semiconductor substrate, wherein the first semiconductor region includes a first doped region formed in a lower portion of the first semiconductor region and a second doped region formed over the first doped region in an upper portion of the first semiconductor region. A defect layer having an upper surface formed in an upper portion of the first doped region. A second semiconductor region of a second semiconductor type is formed over the first semiconductor region.

17 Claims, 6 Drawing Sheets

(56) References Cited

OTHER PUBLICATIONS

Heinemann, Bernd et al., "SiGe HBT with fT/fmax of 505 GHz/720 GHz"; 2016 IEEE International Electron Devices Meeting (IEDM), San Francisco, California, Dec. 3-7, 2016, DOI: 10.1109/IEDM. 2016.7838335.

Korn, Julian et al.; "Experimental and Theoretical Study of fT for SiGe HBTs with a Scaled Vertical Doping Profile"; 2015 IEEE Bipolar/BiCMOS Circuits and Technology Meeting—BCTM, Boston, Massachusetts, Oct. 26-28, 2015; DOI: 10.1109/BCTM.2015. 7340586.

Park Systems; "Scanning Spreading Resistance Microscopy (SSRM)"; Downloaded from the Internet: https://parksystems.com/park-spm-modes/94-electrical-properties/240-scanning-spreading-resistance-microscopy-ssrm.

Sasso, Grazia et al.; "Influence of vertical scaling and temperature on impact-ionization effects in SiGe HBTs"; 2012 24th International Conference on Microelectronics (ICM), Algiers, Algeria, Dec. 16-20, 2012; DOI: 10.1109/ICM.2012.6471370.

Schröter, Michael et al.; "A TCAD-based roadmap for high-speed SiGe HBTs"; 2014 IEEE 14th Topical Meeting on Silicon Monolithic Integrated Circuits in Rf Systems; Jan. 19-23, 2014, Newport Beach, California; DOI: 10.1109/SiRF.2014.6828505.

Schröter, Michael et al; "Physical and Electrical Performance Limits of High-Speed SiGeC HBTs—Part II: Lateral Scaling"; IEEE Transactions on Electron Devices, vol. 58, No. 11; 10 pages; Nov. 2011.

Tsaur, B-Y. et al.; "Triple ion implantation technique for formation of shallow npn bipolar transistor structures in silicon"; 320 Applied Physics Letters, vol. 44, No. 10; May 1984; https://doi.org/10.1063/1.94600.

\* cited by examiner

SEMICONDUCTOR DEVICE WITH A DEFECT LAYER AND METHOD OF FABRICATION THEREFOR

TECHNICAL FIELD

Embodiments of the subject matter described herein relate generally to semiconductor devices, including bipolar junction transistors (BJT's) and heterojunction bipolar transistors (HBT's).

BACKGROUND

Semiconductor devices find application in a wide variety of electronic components and systems. Moreover, useful semiconductor devices for radio frequency (RF), microwave, and millimeter wave applications may include BJT's, HBT's, and related devices. In particular, HBT's are useful in high frequency applications because of their fast transit time, high cutoff frequency, high gain, and good linearity properties. These HBT's act as active gain elements and find applications as active devices in RF, microwave, and millimeter wave power amplifiers, oscillators, and other useful electronic components. In these and other applications for these devices, there is a need for reduced collector junction capacitance ($C_{jc}$). Reduced $C_{jc}$ is important for achieving higher maximum frequency of oscillation ($f_{max}$) and improved frequency response for these applications. The value of $f_{max}$ is inversely proportional to $C_{jc}$. Conventional BJT and HBT structures, have trade-offs between collector junction capacitance, $C_{jc}$, and off-state collector-base breakdown voltage ($BV_{cbo}$). Thus, there is a need for improved performance in BJT and HBT devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of a semiconductor device are described herein. In one aspect, an embodiment of a semiconductor device may include a semiconductor substrate and a first semiconductor region of a first semiconductor type, formed within the semiconductor substrate. The first semiconductor region may include a first doped region formed in a lower portion of the first semiconductor region, a second doped region formed over the first doped region in an upper portion of the first semiconductor region, and a defect layer having an upper surface formed in an upper portion of the first doped region, according to an embodiment. In an embodiment, a second semiconductor region of a second semiconductor type may be formed over the first semiconductor region.

In an embodiment, the defect layer may include dislocation loops coalesced below the upper surface of the defect layer, wherein the upper surface of the defect layer may contact the second doped region. The first semiconductor type may be n-type and the second semiconductor type may be p-type, according to an embodiment. In an embodiment, the second doped region may have a dopant concentration of greater than 1e19 $cm^{-3}$.

The semiconductor device may include a third semiconductor region formed over the second semiconductor region, according to an embodiment. In an embodiment, the first semiconductor region may be configured as a collector region, the second semiconductor region may be configured as a base region, and the third semiconductor region may be configured as an emitter region. A launcher layer that includes a semiconductor material of the first semiconductor type may have a dopant concentration of between 5e16 $cm^{-3}$ and 1e18 $cm^{-3}$ and may be disposed between the collector region and the base region, according to an embodiment.

In other embodiments, a fourth semiconductor region may be formed below the second semiconductor region and between the first doped region, the second doped region, and an isolation region sidewall formed laterally adjacent the first doped region and the second doped region. The fourth semiconductor region may include a doping level below a doping level of the second doped region, according to an embodiment.

In still other embodiments, the first doped region and the second doped region may include a pre-amorphizing dopant. The pre-amorphizing dopant may include germanium, xenon, or tin, according to an embodiment.

In another aspect, an embodiment of the inventive subject matter may include a silicon germanium heterojunction bipolar transistor device that includes a semiconductor substrate that may include silicon. A collector region may be formed within the semiconductor substrate, wherein the collector region may include a first doped region formed in a lower portion of the collector region, a second doped region formed over the first doped region in an upper portion of the collector region, and a defect layer having an upper surface formed in an upper portion of the first doped region, according to an embodiment. In an embodiment, a base region may be formed over the collector region, wherein the base region may include silicon and germanium. An emitter region may be formed over the base region, wherein the emitter region may include silicon. In an embodiment, the second doped region may have a dopant concentration of greater than 1e19 $cm^{-3}$.

In other embodiments, the silicon germanium heterojunction bipolar transistor device may include a spacer region formed below the base region, and between the first doped region, the second doped region, and a collector region sidewall formed laterally adjacent the first doped region and the second doped region. The spacer region may have a doping level below a doping level of the second doped region, according to an embodiment.

In still other embodiments, the first doped region and the second doped region may include a pre-amorphizing dopant.

In another aspect, a method for forming a bipolar transistor is disclosed. In an embodiment, the method may include forming a semiconductor substrate and forming a collector region within the semiconductor substrate. Forming the collector region may include forming a first doped region in a lower portion of the collector region, forming a second doped region over the first doped region in an upper portion of the collector region, and forming a defect region in an upper portion of the first doped region, according to an embodiment. In an embodiment, the method may include forming a base region over the collector region and forming an emitter region formed over the base region. Forming the collector region may include implanting a dopant species into the collector region to create an amorphous layer, according to an embodiment. In an embodiment, the semiconductor substrate may include silicon and the dopant species includes arsenic. The method may include re-crystalizing at least a portion of the amorphous layer to form the first doped region, the second doped region, and the defect region, according to an embodiment. In an embodiment, re-crystalizing the amorphous layer may include one or more of rapid thermal annealing, furnace annealing, and laser annealing. In other embodiments, implanting a dopant species may include implanting a pre-amorphizing dopant species.

In still other embodiments, forming the collector region may include forming a spacer region under the base region, between a collector sidewall and the first doped region and the second doped region. In these embodiments, a dopant concentration of the spacer layer may be lower than a dopant concentration of the second doped region.

Figure 1:
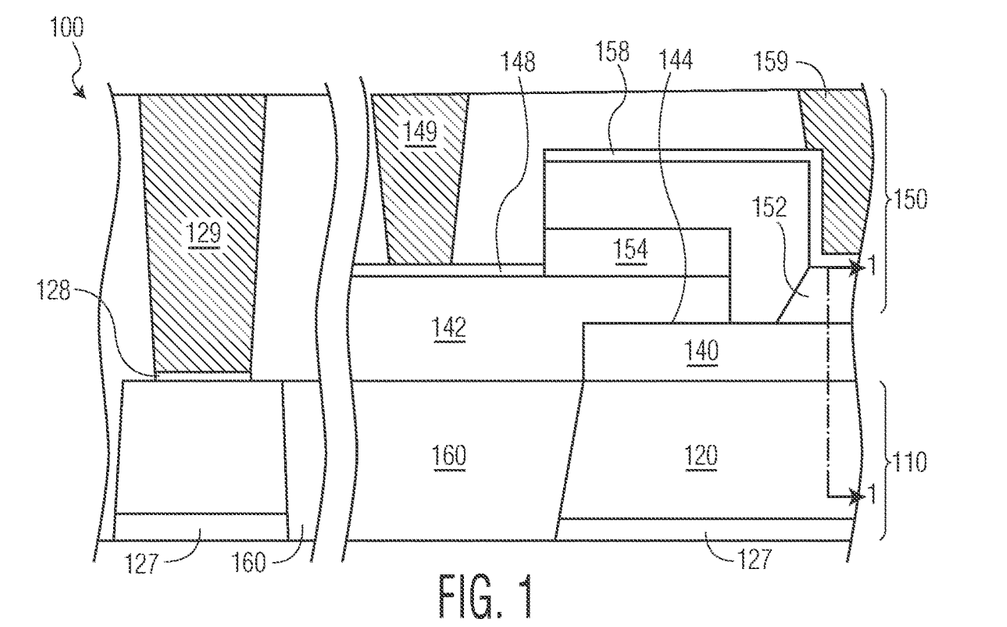
FIG. 1 is a cross sectional side view of a conventional device.

FIG. 1 is a cross sectional side view of a conventional device 100. According to an embodiment, the conventional device 100 may include a semiconductor substrate 110, a collector region 120 formed within the semiconductor substrate 110, a base region 140 disposed over the collector region 120, an extrinsic base region 142 coupled to the base region 140, and an emitter region 150 formed over the base region 140. As with other figures presented herein, FIG. 1 depicts a symmetric half of the conventional device 100. As with the semiconductor devices disclosed herein (e.g., semiconductor devices 200, 400, 500 in FIGS. 2, 4, 5), a full view of the conventional device 100 may be realized by mirroring or rotating the depicted elements of the conventional device 100 about a vertical axis of the emitter region 150.

Referring again to FIG. 1, and in an embodiment, the semiconductor substrate 110 may include a number of semiconductor regions. As used herein, the term, "semiconductor region" may refer to single or multiple semiconductor regions that may include regions formed by implantation (e.g., ion implantation) or layers grown by epitaxial growth. In an embodiment, the collector region 120 may be formed within the semiconductor substrate 110 or in a epitaxially grown layer on substrate 110. A base region 140 may be formed over and in contact with the collector region 120. An extrinsic base region 142 is typically used to couple the base region 140 to a contact layer 148 and a base electrode 149.

In the conventional device 100, the semiconductor substrate 110 may include silicon (Si), carbon (C) and/or germanium (Ge). In the conventional device, the collector region 120 is formed in an upper portion of the semiconductor substrate 110. The base region 140 is formed over the collector region 120. The collector region 120, the base region 140, and the emitter region 150 may include one or more of Si, C and/or Ge. The conventional device 100 is typically configured as a npn transistor such that collector region 120 and the emitter region 150 include a n-type semiconductor and the base region 140 includes a p-type semiconductor. The collector region 120 is typically formed within the semiconductor substrate 110. A sub-collector region 127 is typically formed below the collector region 120 within the semiconductor substrate 110 and is used to provide an electrical path to a contact layer 128 that couples the sub-collector region 127 to the collector electrode 129. In an embodiment, the sub-collector region 127 is typically doped at a higher level than the doping concentration of the collector region 120. A dielectric material region 160 is typically used to provide isolation between devices.

In the conventional device 100, the base region 140 is typically formed using Si or a mixed crystal alloy of Si and Ge, SiGe. In a conventional npn device, the base region 140 is formed using a p-type semiconductor. The base region 140 is typically doped with boron (B). In pnp conventional devices, the base region 140 is formed using an n-type semiconductor. The extrinsic base region 142 may be formed over the semiconductor substrate 110 and provides a low resistance connection to the base electrode 149. An overlap region 144 between the base region 140 and the extrinsic base region 142 over the collector region 120 provides a low contact resistance between the base region 140 and the extrinsic base region 142 so as to provide a lower overall base resistance $R_b$.

In the conventional device 100, the emitter region 150 is formed over the base region 140. According to an embodiment, the emitter region 150 includes an intrinsic emitter region 152, an emitter spacer layer 154, and an emitter contact layer 158 formed over the intrinsic emitter region 152. The emitter region 150 typically also includes an emitter electrode 159 formed over the emitter contact layer 158, according to an embodiment.

Figure 2:
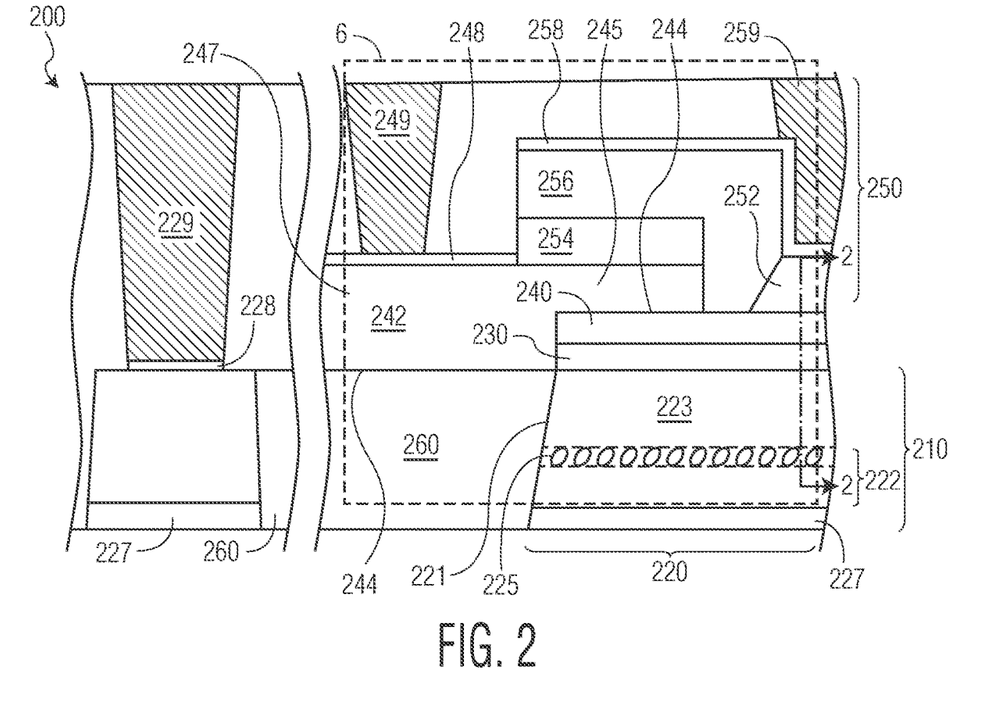
FIG. 2 is a cross sectional side view of a semiconductor device in accordance with an embodiment.

FIG. 2 is a cross sectional side view of an exemplary semiconductor device 200, according to an embodiment. According to an embodiment, a semiconductor device may include a semiconductor substrate 210, a collector region 220 formed within the semiconductor substrate 210, a base region 240 formed over the collector region 220, an emitter region 250 formed over the base region 240, an extrinsic base region 242 coupled to the base region 240, and an isolation dielectric region 260 formed under the extrinsic base region 242, and adjacent to the collector region 220 and the base region 240.

Referring again to FIG. 2, and in an embodiment, the semiconductor substrate 210 may include a number of semiconductor regions. As used herein, the term, "semiconductor region" may refer to single or multiple semiconductor regions that may include regions formed by implantation (e.g., ion implantation) or layers grown by epitaxial growth. In an embodiment, the collector region 220 may be formed within the semiconductor substrate 210. According to an embodiment, a base region 240 may be formed over and in contact with the collector region 220.

In an embodiment, the semiconductor substrate 210 may include one or more of silicon (Si), germanium (Ge), silicon germanium (SiGe), gallium arsenide (GaAs), gallium phosphide (GaP), indium gallium phosphide (InGaP), indium phosphide (InP), gallium nitride (GaN), aluminum nitride (AlN), indium nitride (InN), silicon carbide (SiC), sapphire, or other suitable materials. In other embodiments, the semiconductor substrate 210 may include Si on insulator (SOI). In an embodiment, the collector region 220 may be formed in an upper portion of the semiconductor substrate 210. The base region 240 may be formed over the collector region 220, according to an embodiment. In an embodiment, the collector region 220, the base region 240, and the emitter region 250 may include one or more of Si, Ge, SiGe, and SiGeC. In other embodiments, the collector region 220, the base region 240, and the emitter region 250 may include one or more of GaAs, GaN, AlN, InN, InGaP, and/or other suitable materials. In an embodiment, the semiconductor device 200 may be configured as a npn transistor such that the collector region 220 and the emitter region 250 include a n-type semiconductor and the base region 240 may include a p-type semiconductor. In other embodiments, the semiconductor device 200 may be configured as a pnp transistor such that collector region 220 and the emitter region 250 may include a p-type semiconductor and the base region 240 may include a n-type semiconductor. As used herein, the term "n-type semiconductor" refers to a semiconductor material with a net electron concentration ranging from about 1e15 $cm^{-3}$ to about 1e20 $cm^{-3}$, though other higher or lower electron concentrations may be used. As used herein, the term "p-type semiconductor" refers to a semiconductor material with a hole concentration ranging from about 1e15 $cm^{-3}$ to about 1e20 $cm^{-3}$, though other higher or lower hole concentrations may be included.

In an embodiment, the collector region 220 (i.e., "first semiconductor region") may be formed within the semiconductor substrate 210. According to an embodiment, the collector region 220 may include a collector sidewall (i.e., "isolation sidewall") 221, a first doped region 222 formed in a lower portion of the collector region 220 and adjacent the collector sidewall 221, a second doped region 223 formed over the first doped region 222, and a defect layer 225 formed in an upper portion of the first doped region 222. In an embodiment, an upper surface of the defect layer 225 may terminate the first doped region 222 and may contact the second doped region 223. In an embodiment, the thickness and dopant concentration of the first doped region 222 and the second doped region 223 may be chosen to meet the needs of a particular device design and application.

In an embodiment, the defect layer 225 may include end of range (EOR) defects, dislocation loops, defects known as "{311} defects" (name given since they are observable in the family of {311} crystal planes), and other crystal defects that coalesce in the upper portion of the first doped region. The defect region 225 forms as a result of the relatively high implant dose and subsequent recrystallization anneals of the first and second doped regions 222, 223, according to an embodiment.

In an embodiment, a launcher layer 230 may be disposed over the collector region 220. According to an embodiment, the launcher layer may include a low-doped or undoped material (e.g., Si). The launcher layer 230 may be configured to maximize the velocity of electrons injected into the collector region 220, according to an embodiment.

In some embodiments (e.g., npn transistor device), the collector region 220 may be formed using a n-type semiconductor. In other embodiments (pnp transistor device), the collector region 220 may be formed using a p-type semiconductor. In an embodiment, the total thickness of the collector region 220 may have a total thickness of between about 1000 angstroms and 3000 angstroms. In other embodiments, the collector region 220 may have a total thickness between about 100 angstroms and about 10000 angstroms, though other thicknesses may be used. In an embodiment, the first doped region 222 may have a thickness of between about 500 angstroms and about 2000 angstroms. In other embodiments, the first doped region 222 may have a thickness of between about 50 angstroms and about 9000 angstroms, though other thicker and thinner values may be used. In an embodiment, the second doped region 223 may have a thickness of between about 500 angstroms and about 2000 angstroms. In other embodiments, the second doped region 223 may have a thickness of between about 50 angstroms and about 9000 angstroms, though other thicker and thinner values may be used. In an embodiment, the defect layer 225 may have a thickness of between about 500 angstroms and about 1500 angstroms. In other embodiments, the defect layer 225 may have a thickness of between about 100 angstroms and about 5000 angstroms, though other thicknesses may be used. In an embodiment, the launcher layer 230 may have a thickness of between about 100 angstroms and about 300 angstroms. In other embodiments, the launcher layer 230 may have a thickness of between about 50 angstroms and about 1000 angstroms, though other thicker and thinner values may be used.

In embodiments that include a n-type collector region (e.g., npn transistors), the collector region 220 may be doped with one or more of phosphorous (P), arsenic (As), antimony (Sb), lithium (Li), or other suitable dopants. In some npn embodiments, (n-type collector doping), the dopant concentration of the first doped region 222 may be between about 5e18 $cm^{-3}$ and about 5e20 $cm^{-3}$ dopant concentration. In these npn embodiments, the dopant concentration of the second doped region 223 may be between about 1e18 $cm^{-3}$ and about 2e20 $cm^{-3}$ dopant concentration. In other npn embodiments, the first doped region 222 may have a dopant concentration of between about 2e18 $cm^{-3}$ and about 2e21 $cm^{-3}$, although other higher or lower dopant concentrations may be used. In npn embodiments, the second doped region 223 may have a dopant concentration of between about 1e19 $cm^{-3}$ and 5e20 $cm^{-3}$. In other npn embodiments, the second doped region 223 may have a dopant concentration of between about 1e17 $cm^{-3}$ and 2e21 $cm^{-3}$, although other higher or lower dopant concentrations may be used. Further, in these npn embodiments, the dopant concentration of the launcher layer 230 may be between about 5e16 $cm^{-3}$ and about 1e18 $cm^{-3}$ dopant concentration. In other npn embodiments, the launcher layer 230 may have a dopant concentration of between about 1e16 $cm^{-3}$ and about 5e19 $cm^{-3}$, although other higher or lower dopant concentrations may be used.

In embodiments that include a p-type collector region 220 (e.g., pnp transistors), the collector region 220 may be doped with one or more of carbon (C), boron (B), oxygen (O), or indium (In) though other dopant species may be used. In some pnp embodiments, (p-type collector doping), the dopant concentration of the first doped region 222 may be between about 1e18 $cm^{-3}$ and about 2e20 $cm^{-3}$ dopant concentration. In other pnp embodiments, the first doped region 222 may have a dopant concentration of between about 2e18 $cm^{-3}$ and about 5e20 $cm^{-3}$, although other higher or lower dopant concentrations may be used. In these pnp embodiments, the dopant concentration of the second semiconductor region may be between about 1e18 $cm^{-3}$ and about 5e20 $cm^{-3}$ dopant concentration. In other pnp embodiments, the second doped region 223 may have a dopant concentration of between about 5e17 $cm^{-3}$ and about 2e21 $cm^{-3}$, although other higher or lower dopant concentrations may be used. Further, in these pnp embodiments, the dopant concentration of the launcher layer 230 may be between about 5e16 $cm^{-3}$ and about 1e19 $cm^{-3}$ dopant concentration. In other pnp embodiments, the third doped region 224 may have a dopant concentration of between about 1e16 cm$^{-3}$ and 5e19 cm$^{-3}$, although other higher or lower dopant concentrations may be used.

According to an embodiment, a sub-collector region 227 may be formed below the collector region 220 within the semiconductor substrate 210, and may provide a low resistance connection to the collector electrode 229 through a contact layer 228. In an embodiment, the sub-collector region 227 may have the same doping polarity as the collector region 220, but may be doped at a higher doping concentration. In some embodiments, the sub-collector 227 may be doped at a similar or lower concentration than the collector region 220. In an npn embodiment, the doping concentration of the sub-collector region 227 may be in a range of about 5e18 cm$^{-3}$ to 1e21 cm$^{-3}$. In an embodiment, the sub-collector region 227 may be doped 10 to 100 times higher than the doping concentration of the collector region 220. According to an embodiment, the sub-collector region 227 may be doped 10 to 1000 times higher concentration than the second doped region 223 of the collector region 220.

In an embodiment, the base region 240 may be formed over the collector region 220. The base region 240 may be formed using a p-type semiconductor, according to an embodiment. In an embodiment, the base region 240 may be doped with carbon (C). In other embodiments (e.g., pnp transistors), the base region 240 may be formed using a n-type semiconductor. In an embodiment, the base region 240 may be formed using $S_{1-X}Ge_X$ where X is the Ge mole fraction. In an embodiment, one or more portions of the base region 240 may have a narrower bandgap than the emitter region 250 and the collector region 220. In an embodiment, the bandgap of the one or more portions of the base region 240 may be adjusted by changes in the Ge mole fraction. In an embodiment, the Ge mole fraction, X, may vary between about 0.05 and about 0.3 though other larger or smaller values of X may be used. In an embodiment, the value of the Ge mole fraction may be constant throughout the base region 240. In still other embodiments, the bandgap of the base region 240 may be continuously graded. In these embodiments, the grading of the base material, e.g., $Si_{1-X}Ge_X$ may include forming an upper portion of the base region 240 with a wider bandgap and continuously reducing to a narrower bandgap in a lower portion of the base region 240. In an embodiment of a p-type base region (e.g., npn transistor device), the base region 240 may be doped with one or more of C, B, O, or In though other dopant species may be used. In an embodiment of a n-type base region (e.g., a pnp transistor device), the base region 240 may be doped with one or more of P, Li, As, Sb though other dopant species may be used. In an embodiment, the doping concentration of the base region 240 may be in a range of about 5e17 cm$^{-3}$ to 1e20 cm$^{-3}$. In other embodiments, the doping concentration of the base region 240 may be in a range of about 1e17 cm$^{-3}$ to 1e20 cm$^{-3}$, though other higher or lower doping concentrations may be used.

In an embodiment, the extrinsic base region 242 may be formed over the semiconductor substrate 210. In an embodiment, the extrinsic base region 242 may be formed using poly-silicon. In embodiments that include a p-type base region 240 (e.g., a npn transistor device), the extrinsic base region 242 may be doped with one or more of B, O, In or Al, though other dopant species may be used. In embodiments that include a n-type base region 240 (e.g., a pnp transistor device), the extrinsic base region 242 may be doped with one or more of P, Li, As, or Sb though other dopant species may be used. In an embodiment, the extrinsic base region 242 may include the same dopant species as the base region 240. For example, the base region 240 and the extrinsic base region 242 may both include B doping. In an embodiment, the extrinsic base region 242 may include a first portion 245 formed over the collector region 220 and the base region 240 and a second portion 247 formed in areas of the device adjacent the collector region 220 and the base region 240, over the isolation dielectric region 260. In an embodiment, the extrinsic base region 242 may be coupled to an upper surface 244 of the intrinsic base 240. In an embodiment, a base electrode 249 may be coupled to the first portion 245 of the extrinsic base region 242 through a base contact layer 248.

In an embodiment, the emitter region 250 may be formed over the base region 240. According to an embodiment, the emitter region 250 may include an intrinsic emitter region 252, an emitter spacer layer 254, an extrinsic emitter region 256, and an emitter contact layer 258 formed over the intrinsic emitter region 252. The emitter region 250 may also include an emitter electrode 259 formed over the emitter contact layer 258, according to an embodiment.

In an embodiment, the intrinsic emitter region 252 may be formed over the base region 240 and the extrinsic emitter region 256 may be formed over an emitter spacer layer 254. In an embodiment, the emitter spacer layer 254 may include one or more dielectric layers that include the same or differing dielectric type(s). In an embodiment, the emitter spacer layer 254 may include one or more of silicon dioxide, tetra-ethyl orthosilicate (TEOS), silicon nitride (SiN), silicon oxynitride (SiON), aluminum oxide ($Al_2O_3$), aluminum nitride (AlN), polyimide, benzocyclobutene (BCB), spin-on glass, or other suitable dielectric material(s).

In an embodiment, the intrinsic emitter region 252 may be formed using a n-type semiconductor. In other embodiments, the intrinsic emitter region 252 may be formed using a p-type semiconductor. The intrinsic emitter region 252 may include a single crystal semiconductor, according to an embodiment. In an embodiment, the intrinsic emitter region 252 may have a thickness of between about 100 angstroms and 1000 angstroms. In other embodiments, the intrinsic emitter region 252 may have a thickness of between about 50 angstroms and about 5000 angstroms, though other thicknesses may be used. In an embodiment that includes a p-type emitter region 250 (e.g., an pnp transistor device), the emitter region 252 may be doped with one or more of B, O, Al, or In though other dopant species may be used. In an embodiment of an p-type emitter region (e.g., a pnp transistor device), the base region 240 may be doped with one or more of P, Li, As, or Sb though other dopant species may be used. In an embodiment, the doping concentration of the intrinsic emitter region 252 may be in a range of about 5e17 cm$^{-3}$ to 5e21 cm$^{-3}$.

In an embodiment, the extrinsic emitter region 256 may be formed over the emitter spacer layer 254. In an embodiment, the extrinsic emitter region 256 may include a polycrystalline semiconductor material. In other embodiments, the extrinsic emitter region 256 may be formed using a single crystal semiconductor material. In an embodiment, the extrinsic emitter region 256 may be doped with the same dopant(s) as the intrinsic emitter.

According to an embodiment, the emitter contact layer 258 may be formed over the extrinsic emitter region 256 and the intrinsic emitter region 252. In an embodiment, the emitter contact layer 258 may be formed using titanium-tungsten (TiW), titanium tungsten nitride (TiWN), tungsten silicide (WSi), cobalt silicide (CoSi), platinum silicide (PtSi), nickel platinum silicide (NiPtSi), or other suitable material(s). The emitter electrode 259 may be formed over the emitter contact layer 258, according to an embodiment. In an embodiment, the emitter electrode 259 may be formed from one of copper, aluminum, tungsten, or other suitable conducting materials.

In an embodiment, the isolation dielectric region 260 may be disposed laterally adjacent the base region 240 and under the extrinsic base region 242. The isolation dielectric region 260 may include a plurality of dielectric layers (not shown). A portion of each of the plurality of dielectric layers of the isolation dielectric region 260 may be disposed between a portion of the collector region 220 and the extrinsic base region 242, according to an embodiment. According to an embodiment, the isolation dielectric region 260 may be formed adjacent a portion of the collector region 220, the base region 240, and the sub-collector region 227. In an embodiment, the isolation dielectric region 260 may include one or more dielectric layers that include the same or differing dielectric type(s). In an embodiment, the isolation dielectric region 260 may include one or more of silicon dioxide ($SiO_2$), TEOS, SiN, SiON, $Al_2O_3$, AlN, polyimide, benzocyclobutene (BCB), spin-on glass, or other suitable dielectric material(s). For example, the isolation dielectric region 260 may include TEOS and SiN. In other embodiments, the isolation dielectric region 260 may include SiN. In an embodiment, the total thickness of the isolation dielectric region 260 may be between about 1500 angstroms and about 5000 angstroms, while other thicker or thinner thicknesses may be used.

Figure 3:
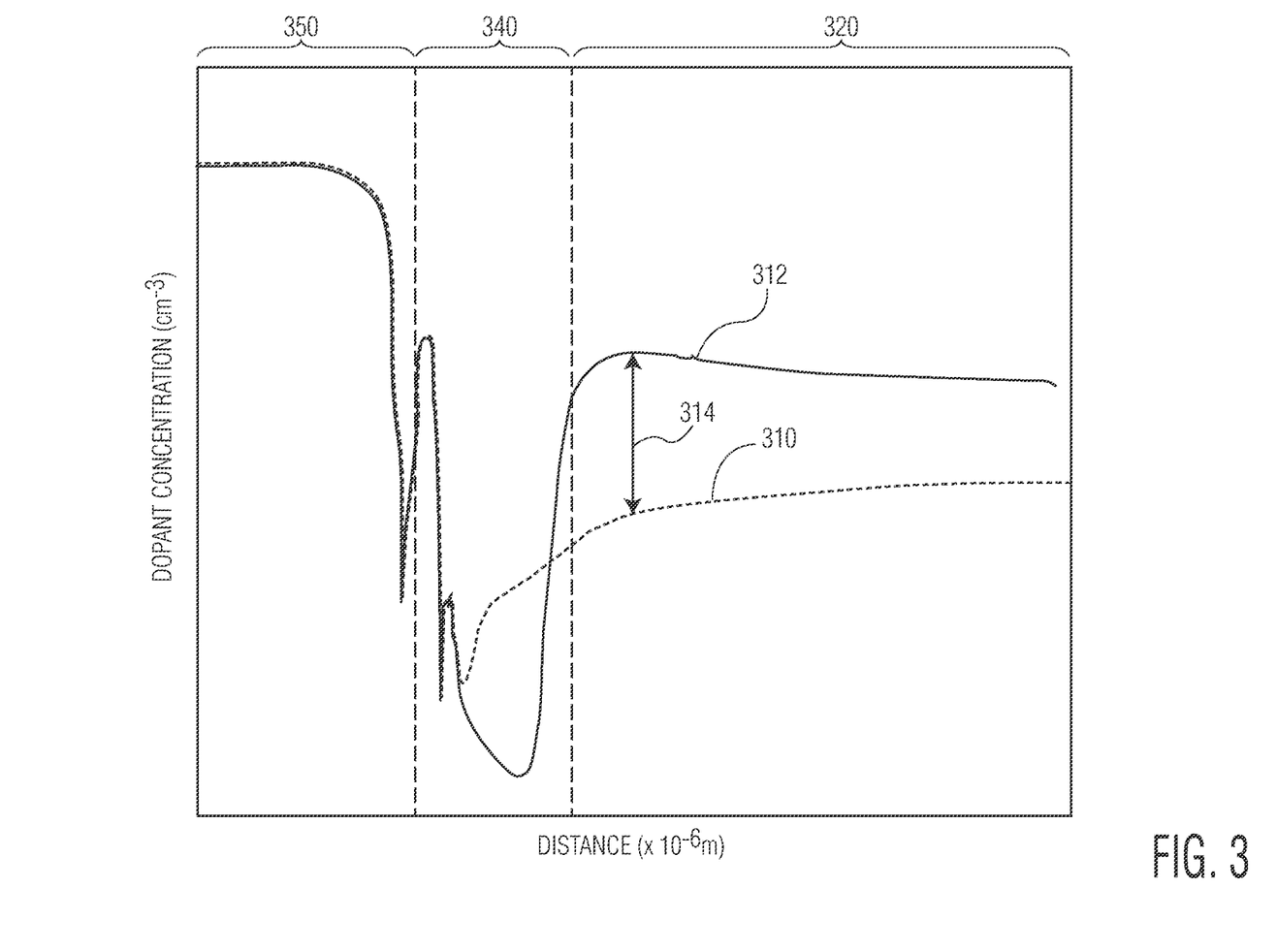
FIG. 3 is a graph of dopant concentration versus distance along cut lines 1-1 and 2-2 shown in FIGS. 1 and 2.

FIG. 3 is a graph of simulated dopant concentration versus distance along cut lines 1-1 and 2-2 shown in FIGS. 1 and 2. Trace 310 represents the dopant concentration along cut line 1-1 in the conventional device 100 of FIG. 1. Trace 312 represents the dopant concentration along cut line 2-2 in the semiconductor device 200 of FIG. 2. In an embodiment, a difference 314 in the doping in a region 320 that represents the collector regions 120, 220 of the conventional device 100 and the semiconductor device 200, the semiconductor device 200 in the collector region 220 may be between about three and ten times higher than the dopant concentration of the conventional device 100 in collector region 120. The difference 314 in doping concentration between conventional devices 100 and the semiconductor device 200 may be higher or lower without limit in other embodiments. Dopant concentrations in the base region 240 and the emitter region 250, represented by regions 340 and 350 are very similar for this comparison.

The semiconductor device 200 of FIG. 2 with the dopant concentration profile described in FIG. 3 may have improved performance compared to conventional devices because of higher collector-emitter breakdown and lower collector resistance. The table below summarizes the difference in simulated performance between the semiconductor device 200 of FIG. 2 and the conventional device 100. In the table, "Conventional Device" refers to the conventional device 100 of FIG. 1, "Example Device" refers to the semiconductor device 200 of FIG. 2. The device metrics listed in the table include a peak unity gate current cutoff frequency ($f_T$) at a collector-emitter voltage of 1.3V in gigahertz (GHz), a peak maximum oscillation frequency ($f_{max}$) at a collector-emitter voltage of 1.3V in GHz, a value of peak base-emitter current gain (beta) that is dimensionless, a collector current at a 660 millivolt (mV) base-emitter voltage in microamperes (μA), a collector junction capacitance ($C_{jc}$) in femto farads (fF), an emitter junction capacitance ($C_{je}$) in fF, a collector-base breakdown voltage ($BV_{cbo}$) in volts (V). As seen from the table, each of these embodiments may have an improved value of $f_{max}$, due, in part, to the reduced values of $C_{jc}$, that arise as a result of the device improvements presented herein. Depending on the trade-offs desired between $f_T$, $f_{max}$, $BV_{cbo}$, $BV_{cbe}$, a particular embodiment of the inventive subject matter presented herein may be selected.

| Metric | Conventional Device | Example Device |
|---|---|---|
| $f_T$ (Vce = 1.3 V) [GHz] | 157 | 178 |
| $f_{max}$ (Vce = 1.3 V) [GHz] | 108 | 141 |
| Beta | 5480 | 4840 |
| Ic_660 mV [μA] | 21 | 18 |
| $C_{jc}$ [fF] | 65 | 50 |
| $C_{je}$ [fF] | 100 | 101 |
| $BV_{cbo}$ [V] | 4.8 | 4.9 |

Figure 4:
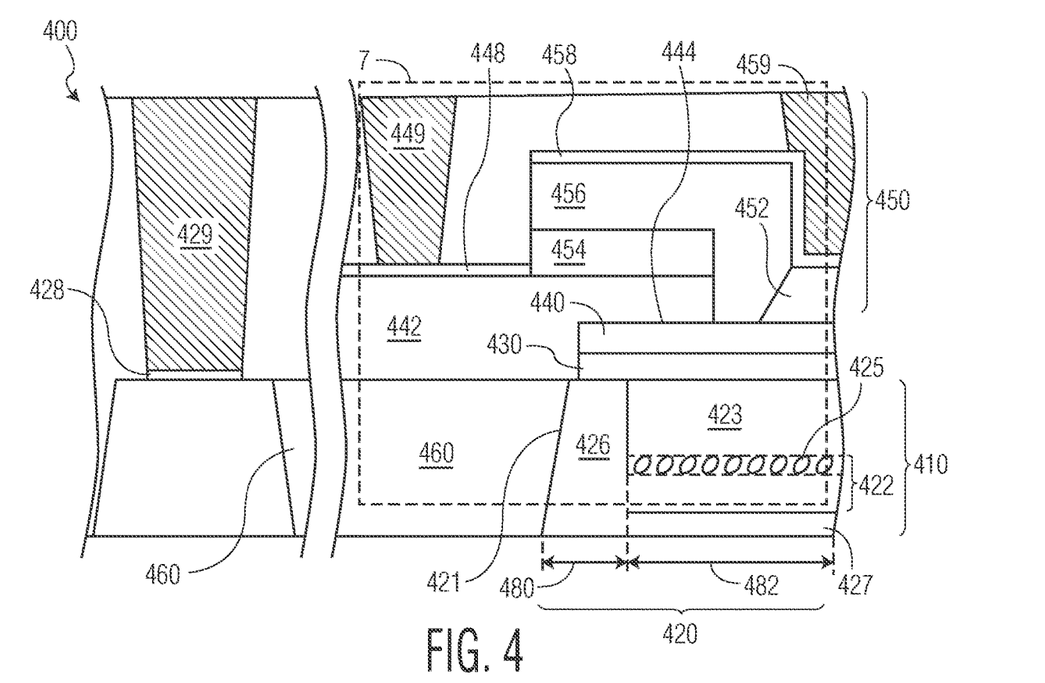
FIG. 4 is a cross sectional side view of a semiconductor device in accordance with an embodiment.
Figure 5:
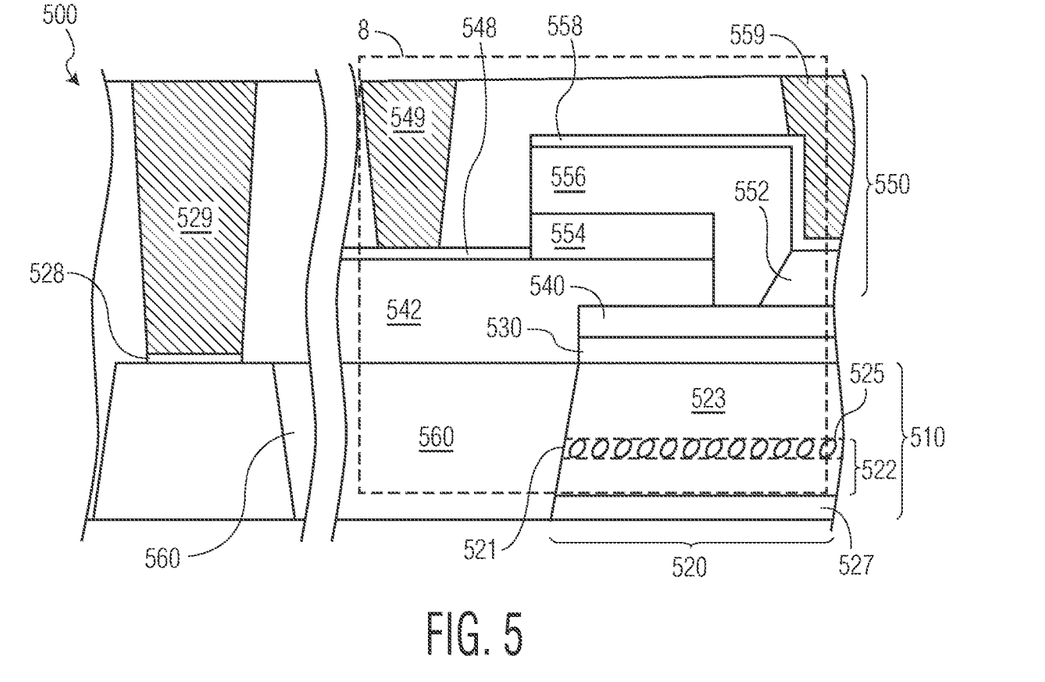
FIG. 5 is a cross sectional side view of a semiconductor device in accordance with an embodiment.

FIGS. 4 and 5 depict further embodiments of semiconductor devices with a defect layer in semiconductor devices 400 and 500, respectively. In these embodiments, the formation of the collector region may be adjusted to allow trade-offs in the performance of the transistors. The numbered drawings in FIGS. 4 and 5 have like numbering and may be compared to the description and reference numbers associated with FIG. 2. For example, the semiconductor substrate 210 in FIG. 2 corresponds to the semiconductor substrates 410 and 510 in FIGS. 4, 5. Also, for the sake of brevity, descriptions of numbered references and fabrication details associated with each numbered item may not be repeated where adequate descriptions are given in connection with the descriptions of FIG. 2.

FIG. 4 is a cross sectional side view of an exemplary semiconductor device 400, according to an embodiment. The semiconductor device 400 may include a semiconductor substrate 410 that includes semiconductor regions to define a collector region 420 with a defect layer 425, a base region 440, an extrinsic base region 440, an emitter region 450, and an isolation dielectric region 460, as described above. A number of other components of the semiconductor device 400 may be configured in a manner similar to the transistor device 200 of FIG. 2. For example, the semiconductor substrate 410 and its associated semiconductor regions (e.g., collector region 420, base region 440, etc.) may be formed in a similar manner as those corresponding regions formed in the semiconductor substrate 210 of FIG. 2.

Referring again to FIG. 4, and in an embodiment, the collector region 420 may include a collector sidewall 421, a first doped region 422 formed in a lower portion of the collector region 420, a second doped region 423 formed over the first doped region 422, and a defect layer 425 formed within an upper portion of the first doped region, wherein the defect layer 425 may contact the second doped region 423. A spacer region 426 (i.e., "fourth semiconductor region") may be formed between the collector sidewall 421 and the first doped region 422, the second doped region 423, and the defect layer 425, according to an embodiment. By controlling the spacer lateral dimension 480 of the spacer 426, the active collector lateral dimension 482 of the first doped region, second doped region, and defect layer 425 may be tailored to achieve a lower value of collector capacitance ($C_{jc}$) to achieve a desired trade-off between $C_{bc}$ and collector resistance ($R_{jc}$). The spacer lateral dimension 480 may be between about 50 and 1500 nm, according to an embodiment. In an embodiment, the active collector lateral dimension 482 may be between about 50 and 1500 nm. In other embodiments, the spacer lateral dimension 480 may be between about 10 and 3000 nm, though other larger or smaller values may be used, according to an embodiment. In these other embodiments, the active collector lateral dimension 482 may be between about 10 and 3000 nm, though other larger or smaller values may be used.

FIG. 5 is a cross sectional side view of an exemplary semiconductor device 500, according to an embodiment. The semiconductor device 500 may include a semiconductor substrate 510 that includes semiconductor regions to define a collector region 520 that includes a first doped region 522 that a defect layer 525, a second doped region 523, a base region 540, an extrinsic base region 542, an emitter region 550, and an isolation dielectric region 560, as described above. A number of other components of the semiconductor device 500 may be configured in a manner similar to the transistor device 200 of FIG. 2. For example, the semiconductor substrate 510 and its associated semiconductor regions (e.g., collector region 520, base region 440, etc.) may be formed in a similar manner as those corresponding regions formed in the semiconductor substrate 210 of FIG. 2.

Referring again to FIG. 5, and in an embodiment, the collector region 520 may include a collector sidewall 521, a first doped region 522 formed in a lower portion of the collector region 520, a second doped region 523 formed over the first doped region 522, and a defect layer 525 within an upper portion of the first doped region 522, forming a boundary between the first doped region 522 and the second doped region 523. In an embodiment, the first doped region 522 and second doped region 523 may include a pre-amorphizing species. In the exemplary semiconductor device 500, the pre-amorphizing species may include Ge implanted into the collector region 520 that may include Si. In other embodiments, the pre-amorphizing species may include xenon (Xe) or tin (Sn). In an embodiment, P may be used as a dopant in the first doped region 522 and second doped region 523 of the collector region 520. In other embodiments, As, Sb, Li, or other suitable dopant may be used as a dopant in the collector region 520.

Figure 6:
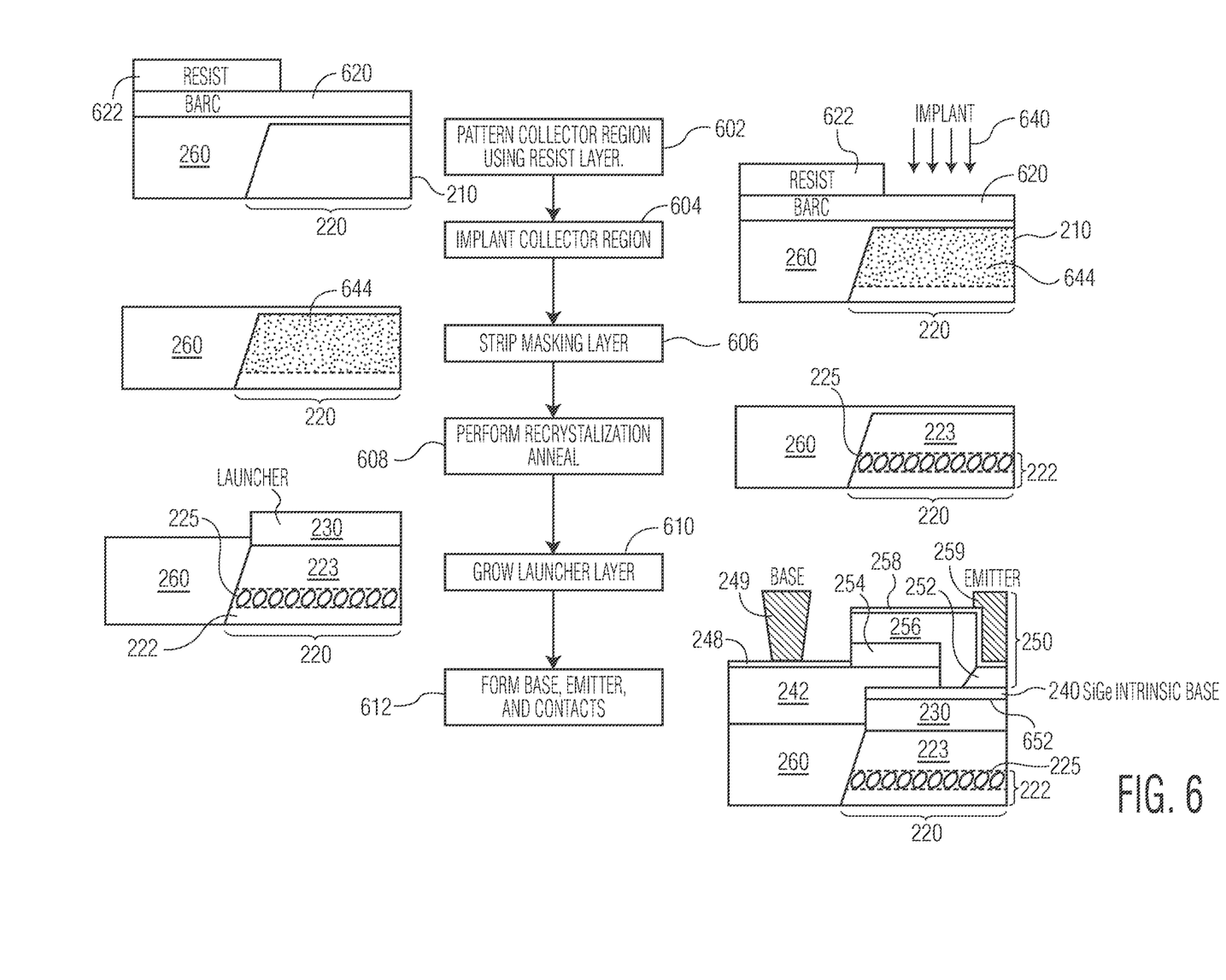
FIG. 6 is a process flow diagram with corresponding cross sectional views describing a method for fabricating the semiconductor devices of FIG. 2 in accordance with an embodiment.
Figure 7:
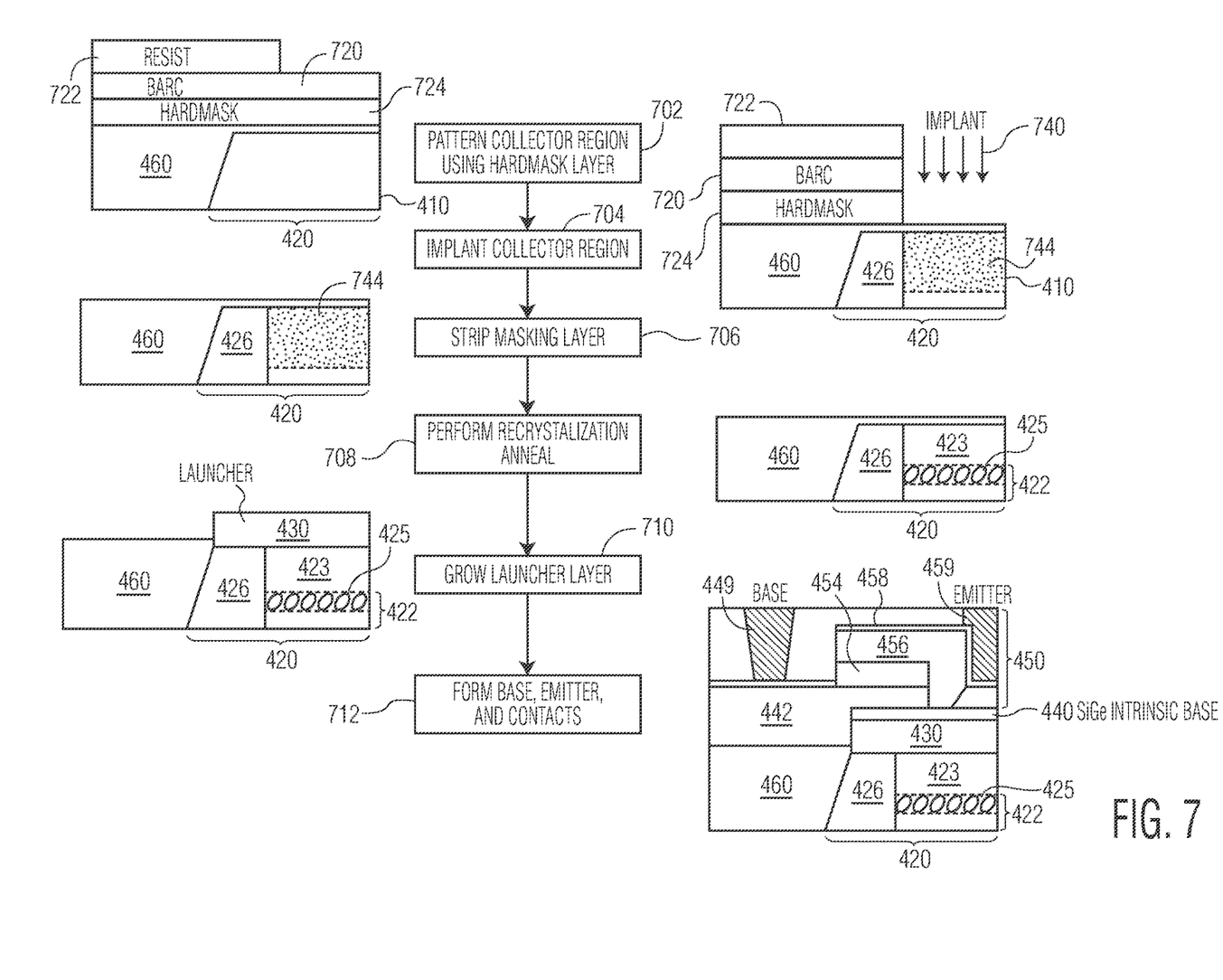
FIG. 7 is a process flow diagram with corresponding cross sectional views describing a method for fabricating the semiconductor devices of FIG. 4 in accordance with an embodiment.
Figure 8:
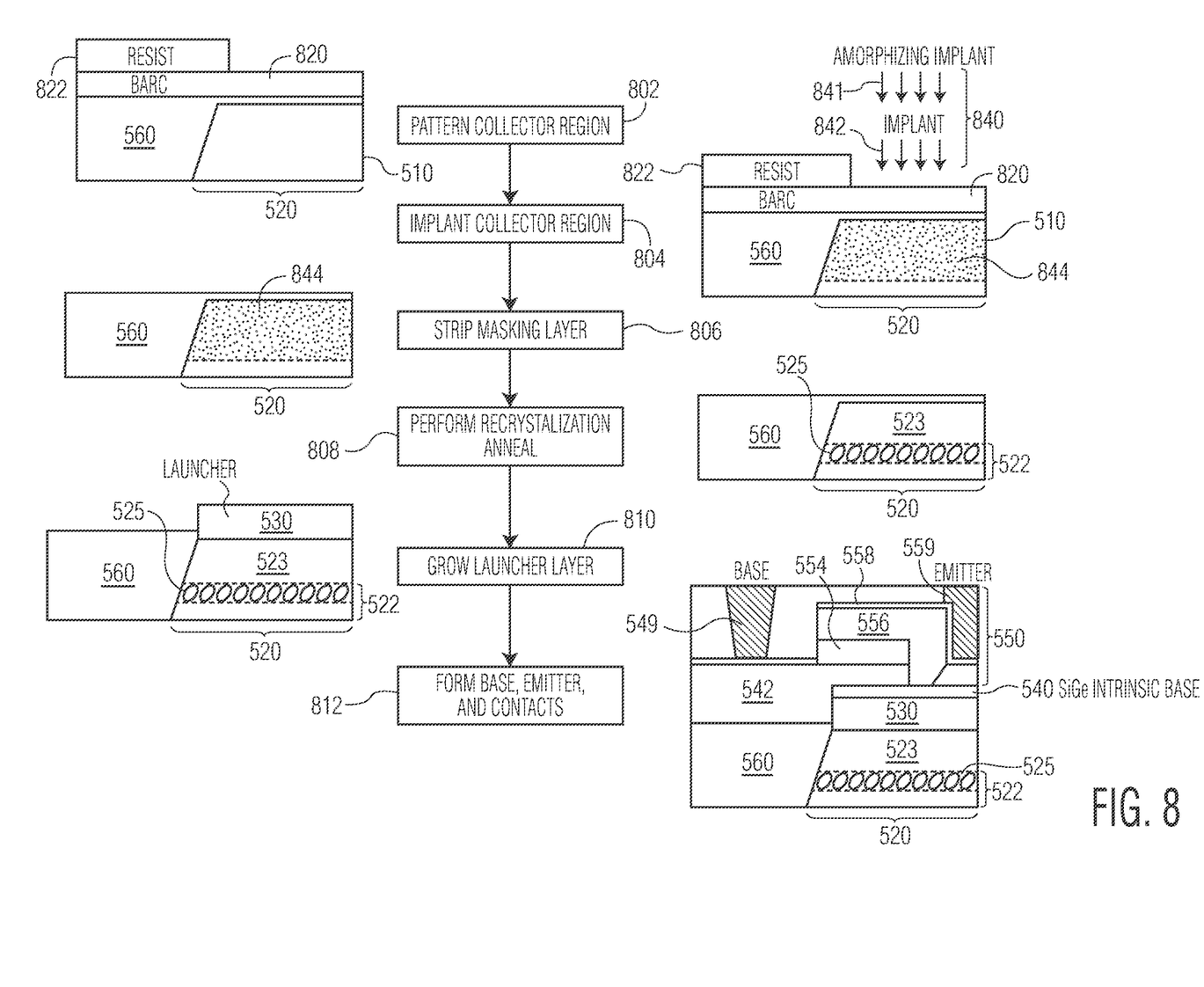
FIG. 8 is a process flow diagram with corresponding cross sectional views describing a method for fabricating the semiconductor devices of FIG. 5 in accordance with an embodiment.

FIGS. 6, 7, and 8 depict process flow diagrams alongside corresponding cross sectional views depicting a series of fabrication steps for producing the bipolar transistor devices 200, 400, and 500 of FIGS. 2, and 4-5, in accordance with an example embodiment method. The method includes a sequence of steps, for which only the salient are shown for convenience in illustration. For example, the method may include a number of acts directed to preparing the semiconductor substrate 210 for the fabrication method. The ordering of the acts may vary in other embodiments.

FIG. 6 is a process flow diagram with corresponding cross sectional side views, detailing partial formation of an area 6 of FIG. 2, and describing a method for fabricating the bipolar transistor device 200 of FIG. 2 in accordance with an embodiment.

In an embodiment, fabrication steps undertaken prior to those shown in FIG. 6 may include implanting the sub-collector region 227 by implanting a dopant species (e.g., phosphorus) using ion implantation (not shown). Dry or wet etching may be used to form a semiconductor region that, after additional processing, will become the collector region 220 (step not shown). In an embodiment, a dielectric material (e.g., TEOS) may be deposited around the collector mesa to form an isolation dielectric layer 260 for, e.g., shallow trench isolation (STI) to provide isolation between adjacent devices. In an embodiment, the one or more layers that comprise the isolation dielectric region 260 may be formed using plasma enhanced chemical vapor phase deposition (PECVD), low pressure chemical vapor phase deposition (LPCVD), chemical vapor phase deposition (CVD), thermal oxide growth techniques, or other suitable deposition techniques.

Referring to FIG. 6, in block 602, the method may include patterning the collector region 220. In an embodiment, patterning the collector region 220 may include forming a bottom anti-reflective coating (BARC) layer 620 over the semiconductor substrate 210. In an embodiment, the BARC layer 620 may be formed using an organic compound with an index of refraction and thickness optimized to suppress reflections at the wavelength of light used for photolithography. In an embodiment, the BARC layer 620 may be dispensed and spun on over the semiconductor substrate 210 and portions of isolation dielectric region 260 covering the semiconductor substrate 210. In other embodiments, the BARC layer 620 may include one or more dielectric layers, e.g., SiON. In these embodiments, the BARC layer 620 may be deposited using LPCVD, PECVD, CVD, thermal oxide growth techniques, or other suitable deposition techniques. In an embodiment, the BARC layer 620 may have a thickness between about 50 nanometers and about 200 nanometers though other thicknesses may be used. In an embodiment, a resist layer 622 may be dispensed over the semiconductor substrate 210. In an embodiment, the resist layer 622 may be configured for patterning by photolithography (photo-resist). In other embodiments, the resist layer 622 may be formed using resist configured for patterning by electron beam lithography (e-beam resist). In an embodiment, the resist layer 622 may have a thickness between about 300 nanometers and about 600 nanometers. In other embodiments, the resist layer 622 may have a thickness between about 100 nanometers and about 10000 nanometers, although other thinner or thicker thicknesses may be used.

Referring now to FIG. 6, block 604, an embodiment of the method may include implanting one or more dopant species into the collector region 220. In an embodiment, the one or more dopant species may be implanted using ion implantation dose(s) 640. In an embodiment, As may be implanted into the collector region 220. In an exemplary embodiment, an As implant schedule included in ion implantation dose(s) 640 may include an implant schedule that includes a first dose, a second dose, and a third dose. In an embodiment, the first dose may include an areal concentration between about $4e14$ $cm^{-2}$ and between about $8e14$ $cm^{-2}$ and an energy between about 300 thousand electron volts (keV) and about 500 keV. The second dose may include an areal concentration between about $1e14$ $cm^{-2}$ and between about $3e14$ $cm^{-2}$ and an energy between about 100 keV and about 180 keV, according to an embodiment. In an embodiment, the third dose may include an areal concentration between about $0.5$ $e14$ $cm^{-2}$ and between about $1.5$ $e14$ $cm^{-2}$ and an energy between about 50 keV and about 150 keV. In other embodiments, greater or fewer numbers of doses and or doses with higher or lower areal concentrations and energies may be used without limitation to achieve the requirements of any specific embodiments. In still other embodiments, dopants may be incorporated into the collector region 220 using impurities introduced during epitaxial growth of the collector region 220. In an embodiment, the implantation of the dopant species approaches the solubility limit for the dopant species in the semiconductor substrate 210 (e.g., Si). In an embodiment, the relatively high implant dose generates sufficient point defects in the crystal lattice of the semiconductor substrate that may turn the region into an amorphous region 644 within the collector region 220.

Referring now to FIG. 6, in block 606, an embodiment of the method may include stripping the resist or masking layer formed and patterned in block 602. In an embodiment, stripping the resist may include subjecting the resist to one or more of wet stripping the resist using an appropriate resist strip chemical, ashing in, e.g., oxygen plasma, or a combination of both. In an embodiment, the BARC layer 620 may be stripped using the same chemistry as the resist layer. In other embodiments, additional chemical processing (e.g., dry or wet chemistry to etch dielectrics if, e.g., dielectric material is used to form the BARC layer 620) may be used to remove the BARC layer 620.

Referring to FIG. 6, in block 608, the method may further include performing a re-crystallization anneal of the implanted collector region 220. In an embodiment, the re-crystallization anneal may include a low temperature anneal. The re-crystallization anneal may be accomplished using one or more of a rapid thermal annealer (RTA), laser, and/or a furnace. The re-crystallization anneal may be performed at a temperature of between about 500 degrees Celsius (° C.) and about 650° C., according to an embodiment. In other embodiments, the re-crystallization anneal may be performed at a temperature of between about 400 degrees Celsius (° C.) and about 1000° C. though higher or lower temperatures may be used, according to an embodiment. In an embodiment, the re-crystallization anneal may have a duration between about 10 seconds and about 100 seconds. In other embodiments, the re-crystallization anneal may have a duration between about 5 seconds and about 500 seconds, though shorter or longer durations may be used. In an embodiment, the low temperature anneal may be performed in a nitrogen environment. In other embodiments, the low temperature anneal may be combined with a laser irradiation or "spike" of the collector region 220. In these embodiments, a laser beam may be scanned to provide a laser spike that locally heats the collector region 220. In some embodiments, the laser spike may melt the amorphous region to re-crystalize the amorphous layer formed in the collector region 220. In an embodiment, the re-crystallization anneal may re-crystalize the amorphous layer in the collector region 220. In an embodiment, a defect layer 225 may form in an upper portion of the first doped region 222, as a result of the re-crystallization anneal. In some embodiments, the re-crystallization anneal may recrystallize only the second doped region 223 and leave the amorphous region within a portion the first doped region 222 (not shown).

Referring to FIG. 6, in block 610, an embodiment of the method may include forming the launcher layer 230. According to an embodiment, forming the launcher layer 230 may include forming a semiconductor, e.g., Si, layer epitaxial layer growth over the collector region 220. Before forming the launcher layer, a portion of isolation dielectric region 260 over the collector region 220 may be removed using dry (e.g., reactive ion etching (RIE) or inductively coupled plasma (ICP) etching) and/or wet etching to expose the collector region 220 (not shown). In an embodiment, the launcher layer 230 may be formed using epitaxial growth such as metal organic chemical vapor phase epitaxy (MOCVD), chemical vapor deposition (CVD), molecular beam epitaxy (MBE), or other suitable methods. In other embodiments, the launcher layer 230 may be formed by ion implantation into a semiconductor region over the collector region 220 (not shown).

Referring to FIG. 6, in block 612, the method may include forming the base region 240 over the launcher layer 230 and collector region 220, forming the emitter region 250, and contacts associated with the collector region 220, the base region 240, and the emitter region 250. In an embodiment, the base region 240 may be formed on an exposed upper surface 650 of the launcher layer 230. In an embodiment, CVD or MOCVD may be used to epitaxially grow the base region 240 using selective epitaxial growth. In an embodiment, the selective epitaxial growth may be facilitated by allowing the epitaxial material to only nucleate on the exposed semiconductor regions (e.g., the launcher layer 230 or, in other embodiments, the collector region 220 (not shown)). The epitaxial material may not nucleate on and grow over the surrounding semiconductor areas, according to an embodiment. In an embodiment, non-selective epitaxy may facilitate epitaxial (monocrystalline) growth of the launcher layer 230 and base region 240 over exposed collector region 223, while depositing polycrystalline material over dielectric region 260 (not shown).

Referring still to FIG. 6, block 612, after forming the base region 240, the extrinsic base region 242 may be formed over at least a portion of the base region 240 to electrically couple the base region 240 to the extrinsic base region 242, according to an embodiment. In an embodiment, the extrinsic base region 242 may be formed using CVD or MOCVD or other suitable means to deposit p+ poly Si or p+ single crystal Si. In other embodiments, the extrinsic base region 242 may be formed prior to forming the base region 240 and a separate base link formed as part of the deposition of a second base region layer may be formed to electrically couple the extrinsic base region to the base region (not shown).

Referring still to FIG. 6, block 612, after forming the extrinsic base region 242 and electrically coupling it to the base region 240, the method may include forming the emitter region 250 over the base region 240, according to an embodiment. In an embodiment, forming the emitter region 250 may include forming the intrinsic emitter region 252 over the base region 240 within an emitter window 652. In an embodiment, the emitter spacer layer 254 may be formed over the extrinsic base region 242. In an embodiment, the emitter spacer 254 may include, e.g., SiN or TEOS though other materials may be used. The emitter spacer layer may be formed using PECVD, LPCVD, or CVD deposition. An emitter window 652 may be formed in the emitter spacer layer 254 utilizing anisotropic vertical etching to remove the dielectric over the base region 240. In some embodiments, the anisotropic etching may be used to retain dielectric layers on the sidewalls of the emitter window 652 (not shown). Following spacer formation, the intrinsic emitter region 252 may be formed. In an embodiment, CVD or MOCVD may be used to epitaxially grow the intrinsic emitter region 252 using selective epitaxial growth. The extrinsic emitter region 256 may be grown over the emitter spacer layer at the same time the intrinsic emitter region 252 is grown, according to an embodiment.

Referring still to FIG. 6, block 612, in an embodiment, device processing may be completed by forming base contact layer 248, emitter contact layer 258, collector contact layer 228 (not shown), the base electrode 249, the emitter electrode 259, and the collector electrode 229 (not shown). The contact layers 228, 248, 258 may be formed using physical vapor deposition (PVD) or other suitable technique(s), according to an embodiment. In an embodiment, the collector, base, and emitter electrodes 229, 249, 259 may be formed using physical vapor deposition (PVD) or other suitable technique(s). Following this, other processing such as dielectric deposition, additional metallization, planarization, and the fabrication of other components may follow, depending on the device application and requirements (not shown).

FIGS. 7 and 8 depict various methods for forming bipolar transistor devices according to the embodiments of bipolar transistor devices 400 and 500 of FIG. 4, and FIG. 5, respectively. The numbered drawing in these figures have like numbering and may be compared to the description associated with FIGS. 7-8 and the corresponding numbering in FIGS. 4-5. For example, the semiconductor substrate 210 in FIG. 2, correspond to the semiconductor substrates 410, and 510 in FIGS. 4-5 and FIGS. 7-8. Also, for the sake of brevity, descriptions of numbered references and fabrication details associated with each numbered item or step may not be repeated where adequate descriptions were given in connection with the descriptions of FIG. 6 and FIG. 2.

FIG. 7 depicts a process flow process flow diagram with corresponding cross sectional side views, detailing forming an area 7 of FIG. 4, and describing a method for fabricating bipolar transistor device 400 of FIG. 4 in accordance with an embodiment. Referring now to FIG. 7, block 702, and, in an embodiment, patterning the collector layer 420 may include forming a BARC layer 720 and a resist layer 722 over a hard mask layer 724. According to an embodiment, the hard mask layer 724 may be formed using, e.g., SiN deposited by LPCVD or PECVD. In an embodiment, the use of the hard mask layer 724 may allow smaller dimensions to be used to create the spacer layer 426 and a smaller lateral dimension of the active portion of the collector region 420 (e.g., collector active lateral dimension 482 of FIG. 4). The remaining fabrication steps detailed in blocks 704-712 may be performed analogously to those of described in connection with blocks 604-612 of FIG. 6.

FIG. 8 depicts a process flow process flow diagram with corresponding cross sectional side views, detailing forming an area 8 of FIG. 5. Referring to block 804 of FIG. 8, after patterning the collector region as depicted in block 802 of FIG. 8, the collector region 520 may be implanted with ion implantation doses 840. The ion implantation doses 840 may include a pre-amorphizing implant 841 and a dopant implant 842. The pre-amorphizing implant 841 that may include, e.g., Ge, Xe or Sn. After the pre-amorphizing implant 841, the doping implant 842, e.g., P, may be used to realize the doping of the collector region 520. In other embodiments, Li, As, or Sb may be used to realize the doping of the collector region 520. As a result of the pre-amorphizing implant 841 and the implant 842, an amorphous region 844 may be formed. After the completion of the ion implantation doses 840, the remaining fabrication steps detailed in blocks 804-812 may be performed analogously to those described in connection with blocks 604-612 of FIG. 6.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary, or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
a semiconductor substrate;
a first semiconductor region of a first semiconductor type, formed within the semiconductor substrate, wherein the first semiconductor region includes a first doped region formed in a lower portion of the first semiconductor region and a second doped region formed over the first doped region in an upper portion of the first semiconductor region, and a defect layer having an upper surface formed in an upper portion of the first doped region, wherein the first doped region has a dopant concentration higher than a dopant concentration of the second doped region;
a second semiconductor region of a second semiconductor type formed over the first semiconductor region; and
a fourth semiconductor region formed below the second semiconductor region and between the first doped region, the second doped region, and an isolation region sidewall formed laterally adjacent the first doped region and the second doped region, wherein the fourth semiconductor region includes a doping level below a doping level of the second doped region.

2. The semiconductor device of claim 1, wherein the defect layer includes dislocation loops coalesced below the upper surface of the defect layer, and wherein the upper surface of the defect layer contacts the second doped region.

3. The semiconductor device of claim 1, wherein the first semiconductor type is n-type, and the second semiconductor type is p-type.

4. The semiconductor device of claim 1, wherein the second doped region has a dopant concentration of greater than $1e19$ cm$^{-3}$.

5. The semiconductor device of claim 1, further comprising a third semiconductor region formed over the second semiconductor region, wherein the first semiconductor region is configured as a collector region, the second semiconductor region is configured as a base region, and the third semiconductor region is configured as an emitter region.

6. The semiconductor device of claim 5, further comprising a launcher layer that includes a semiconductor material of the first semiconductor type having a dopant concentration of between 5e16 cm$^{-3}$ and 1e18 cm$^{-3}$ disposed between the collector region and the base region.

7. The semiconductor device of claim 1, wherein the first doped region and the second doped region include a pre-amorphizing dopant.

8. The semiconductor device of claim 7, wherein the pre-amorphizing dopant is selected from the group consisting of germanium, xenon, and tin.

9. A bipolar transistor device comprising:
a semiconductor substrate that includes silicon;
a collector region, formed within the semiconductor substrate, wherein the collector region includes a first doped region formed in a lower portion of the collector region, a second doped region formed over the first doped region in an upper portion of the collector region, and a defect layer having an upper surface formed in an upper portion of the first doped region wherein the first doped region has a dopant concentration higher than a dopant concentration of the second doped region;
a base region formed over the collector region, wherein the base region includes single crystal silicon and germanium;
an emitter region formed over the base region, wherein the emitter region includes silicon; and
a spacer region formed below the base region and between the first doped region, the second doped region, and a collector region sidewall formed laterally adjacent the first doped region and the second doped region, wherein the spacer region includes a doping level below a doping level of the second doped region.

10. The silicon germanium heterojunction bipolar transistor device of claim 9, wherein the second doped region has a dopant concentration of greater than 1e19 cm$^{-3}$.

11. The silicon germanium heterojunction bipolar transistor device of claim 9, wherein the first doped region and the second doped region include a pre-amorphizing dopant.

12. A method for forming a bipolar transistor device, the method comprising:
forming a semiconductor substrate;
forming a collector region within the semiconductor substrate, wherein forming the collector region includes forming a first doped region in a lower portion of the collector region, forming a second doped region over the first doped region in an upper portion of the collector region, and forming a defect region between the first doped region and the second doped region wherein the first doped region has a dopant concentration higher than a dopant concentration of the second doped region, and wherein forming the collector region includes forming a spacer region under the base region, between a collector sidewall and the first doped region and the second doped region, wherein a dopant concentration of the spacer region is lower than a dopant concentration of the second doped region;
forming a base region formed over the collector region; and
forming an emitter region formed over the base region.

13. The method of claim 12, wherein forming the collector region includes implanting a dopant species into the collector region to create an amorphous layer.

14. The method of claim 13, wherein the semiconductor substrate includes silicon and the dopant species includes arsenic.

15. The method of claim 13, further comprising re-crystalizing at least a portion of the amorphous layer to form the first doped region, the second doped region, and the defect region.

16. The method of claim 15, wherein re-crystalizing the amorphous layer includes a method selected from the group consisting of rapid thermal annealing, furnace annealing, and laser annealing.

17. The method of claim 13, wherein implanting a dopant species includes implanting a pre-amorphizing dopant species.

* * * * *